United States Patent [19]

Duesdieker

[11] Patent Number: 4,783,385

[45] Date of Patent: Nov. 8, 1988

[54] PHOTOGRAPHIC MASKS FOR TONAL CORRECTION

[75] Inventor: Gerhard F. Duesdieker, Herford, Fed. Rep. of Germany

[73] Assignee: E. I. Du Pont de Nemours and Company, Wilmington, Del.

[21] Appl. No.: 32,374

[22] Filed: Mar. 31, 1987

[30] Foreign Application Priority Data

Apr. 30, 1986 [DE] Fed. Rep. of Germany ....... 3614684

[51] Int. Cl.$^4$ .............................................. G03F 9/00
[52] U.S. Cl. .......................................... 430/7; 430/4; 430/293; 430/359; 430/396
[58] Field of Search ............... 430/359, 293, 7, 5, 430/6, 4, 9, 43, 396, 271, 358

[56] References Cited

U.S. PATENT DOCUMENTS

| | | | |
|---|---|---|---|
| 2,692,825 | 11/1954 | Sportelli | 430/359 |
| 2,701,196 | 2/1955 | Conrad | 430/359 |
| 3,085,878 | 4/1963 | Archer | 430/7 |
| 3,251,689 | 5/1966 | Hellmig | 430/359 |
| 3,615,441 | 11/1971 | Deneau | 430/359 |
| 4,241,153 | 12/1980 | Rovnjev | 430/356 |
| 4,262,071 | 4/1981 | Larson | 430/293 |
| 4,329,411 | 5/1982 | Land | 430/359 |
| 4,339,517 | 7/1982 | Akimoto | 430/359 |
| 4,450,215 | 5/1984 | Reithel | 430/7 |
| 4,670,371 | 6/1987 | Mino et al. | 430/293 |

*Primary Examiner*—John E. Kittle
*Assistant Examiner*—Donald J. Loney

[57] ABSTRACT

Process for production of photographic masks for tonal correction by dry dot etching comprising exposing a mask film, e.g., positive film, behind a film combination of half-tone positives and negatives that contains at least one pair of a positive and a negative of the same color separation, said pair being separated from one another by a spacer film, e.g., transparent, matt film, etc. The half-tone values at the points to be corrected are in the range of 30–70%.

6 Claims, 1 Drawing Sheet

F I G. 1
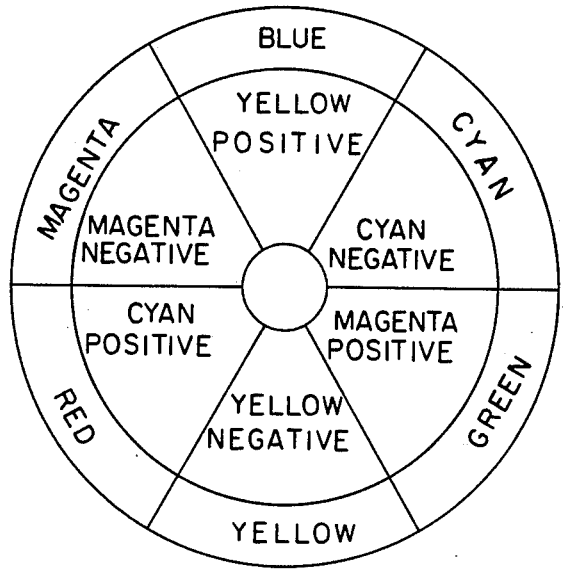
F I G. 2
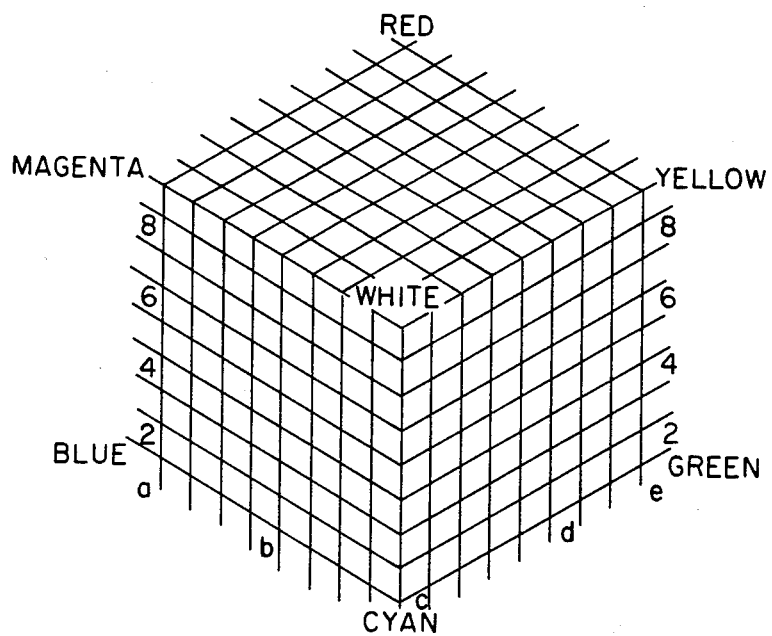

PHOTOGRAPHIC MASKS FOR TONAL CORRECTION

FIELD OF THE INVENTION

The invention relates to a process for the production of photographic masks for tonal correction by dry dot etching.

BACKGROUND OF THE INVENTION

In color reproduction, half-tone color separations are used as copy originals for the production of offset- or relief-printing plates. Before the printing plates are exposed, the color separations are proofed using color proofing methods to check that the tonal values of the colors meet expectations in all parts of the image. If this is not the case, the color separations must be corrected accordingly.

To make corrections, the color separation, partially protected by a varnish, if necessary, is treated, e.g. with Farmer's reducer, which reduces the size of the half-tone dots by oxidative decomposition (dot-etching). This process previously has been used almost exclusively but has several disadvantages and is therefore being increasingly supplemented recently by dry re-touching (dry dot etching).

Dry dot etching is based on the principle that a copy is made of the color separation to be corrected, the size of whose half-tone dots has been changed in the copying process by overexposure and underillumination. In this manner both plus and minus corrections are possible. If such corrections are only to be carried out in partial areas of the color separations, the remaining areas are protected by suitable masks. Such masks can be cut from masking-type films for simple designs and corrections to individual colors. With more complex designs and corrections to more than one color, photomechanically produced masks are used.

Such masks are usually produced by the compensation method: depending on the color tone to be corrected, a combination of half-tone color separation negatives and/or positives is bound up together, corresponding to the mask combination diagram shown in FIG. 1. The colors to be corrected, i.e., that must appear transparent on the mask combination, are entered on the outer ring. The required mask combination is given by the section of the circle assigned to this color and the two neighboring sections of the circle (see Deutscher Drucker No. 16, p. 47, 1984).

At most, therefore, three films of each color set (positives or negatives) are used, with each color only being represented once. After these films have been bound in accurate register, the combination, with diffusing sheets, e.g., Cronaflex ®UC-7 Tracing Film (drafting film), E. I. du Pont de Nemours and Company, Wilmington, Del. or a suitable matt drafting film or other type light diffusing film, intercalated between the color separations (positive or negative) and the unexposed film to suppress the half-tone dot structure, is copied onto a silver halide photographic film, e.g., positive film, and after development gives the desired mask. Additional diffusion sheets can be inserted between the exposure source and the color separations. The mask exhibits a high degree of masking with the exception of the areas to be corrected. Now the actual tonal correction takes place, in that the color separation to be corrected is copied alone using a first exposure and is copied with the mask onto a suitable line- or half-tone silver halide screen film, e.g., Cronar ® BLD-4 Bright Light Duplicating Film, Cronar ® BLE-4 Bright Light Etchable Contract Film, both manufactured by E. I. du Pont de Nemours and Company, Wilmington, Del., etc. usng a second exposure.

This method is well suited to the correction of tonal values of relatively pure colors. It fails, however, with blackened colors (tertiary colors, i.e.. non-pure colors which contain all three basic colors, such as brownish), with similar color tones adjacent to one another that must be separated from one another, as well as especially in cases in which only the range of the middle tones is to be corrected without simultaneously influencing the range of the highlight- and shadow tones.

It is therefore an object of the present invention to give a process for the production of photographic masks that avoids the aforementioned disadvantages.

SUMMARY OF THE INVENTION

In accordance with this invention there is provided a process for the production of photographic masks for tonal correction by dry dot etching comprising (A) exposing a silver halide photographic mask film behind a film combination, bound in accurate register, of a half-tone positive and half-tone negative of a color separation set and diffusion sheets, characterized in that the film combination comprises at least one pair of a positive and a negative of the same color separation, whereby the positive and negative are separated from one another by a film taken from the group consisting of spacer film and color separation film, and (B) developing the mask film.

BRIEF DESCRIPTION OF THE DRAWINGS

This invention may be more fully understood from the following detailed description thereof taken in connection with the accompanying drawings which form a part of this invention and in which:

FIG. 1 is a diagram of a mask combination needed to correct the colors set out on the outer ring thereof.

FIG. 2 is a color cube which is a three-dimensional diagram showing the interaction of the three printing colors. It is used as a test target.

The positive-negative pairs are produced from color separations whose half-tone values at the points to be corrected are in the range of 30–70%, preferably 40–60%. These percentages give the dot size, e.g., 50% dot size is a chessboard pattern.

The half-tone negative (or positive) belonging to the half-tone positive (or -negative) of the same color separation is preferably obtained by recopying with correct tonal values.

It is surprising for those skilled in the art that half-tone positives and-negatives can be combined in this manner and in addition the desired effect of an opening of the middle tones can still be achieved, since it is known that with half-tone films, the densities of positives and negatives are additive to form a uniform unstructured density.

In addition to one or more such positive-negative pairs of the same color separation, further half-tone positives or -negatives of different color separations can also be used in order to undertake other color- and tonal corrections simultaneously in the known manner. Up to a total of 8 half-tone positives or -negatives (1 pair of each color) can be used, but in most cases a satisfactory result is obtained with up to 5 such films. In contrast to earlier processes, which were limited to at most 3 different color separations, the correction possibilities are therefore considerably higher with the process of the invention; this makes it possible to manage with one single correction mask and a higher-quality printing result is achieved overall.

When making the copy of the entire film combination bound in accurate register on a masking-type film (preferably direct-positive film), e.g., high gradient graphic arts films. Preferably Cronar ® BLC-4 Bright Light Contact Film, Cronar ® BLD-4 Bright Light Duplicating Film, Cronar ® BLE-4 Bright Light Etchable Contact Film, E. I. du Pont de Nemours and Company, Wilmington, Del., care must be taken that the negative and positive of the same color separation do not lie in direct layer-on-layer contact. A spacer film is used to provide suitable separation. The spacer film can be taken from known films that are transparent film, matted film, the film support of a color separation or combinations thereof. The spacer film(s) is generally 100 to 200 $\mu$m in thickness. Moreover, to avoid moiré patterns and for resolution of the half-tone dot structure, several matt diffusion films must be used in the film combination. Such diffusion films can be between the color separation (negative or positive) and the unexposed film, or between the exposure source and the color separations.

The exposure time required to copy the entire combination can be calculated by computer, whose program also undertakes the selection of the necessary individual color separations. When a computor is not used, the exposure time can be derived from densitometer readings and/or be determined by test exposures or by experience of a skilled artisan.

EXAMPLES

The invention is described in more detail by the following examples which do not limit the invention.

EXAMPLE 1

Half-tone color separations are produced in the usual manner from a color cube according to FIG. 2, which contains colors in various stages of brightness increasing from 1–9 (Note: odd numbers are not specifically set out in FIG. 2). The tonal values in the middle tone range of the cyan separation must be intensified, without changing highlights and shadow areas. To accomplish this, the cyan positive is recopied by printing in direct contact to a negative working line or halftone film, such as Cronar ® BLE-4 Bright Light Etchable Contact Film to achieve a dot-for-dot reproduction to produce a negative. Both the cyan negative and cyan positive are bound in accurate register with an intercalated matt drafting film 180 $\mu$m thick and are copied through two further matt films placed on the top and bottom of the sandwich onto a blue-sensitive positive line contact film such as a bright light duplicating (direct-positive) film, e.g., Cronar ® BLD-4 Bright Light Duplicating Film. After developing for 20 seconds at 38° C. in rapid access developer CUFD, E. I. du Pont de Nemours and Company Wilmington, Del., in a Du Pont 26C Processor. a mask with the following density profile along lines a–e of FIG. 2 is obtained.

|   | a    | b    | c    | d    | e    |
|---|------|------|------|------|------|
| 1 | >5   | >5   | >5   | >5   | >5   |
| 2 | 0.83 | 0.64 | 0.57 | 0.48 | 0.49 |

-continued

|   | a    | b    | c    | d    | e    |
|---|------|------|------|------|------|
| 3 | 0.26 | 0.16 | 0.14 | 0.12 | 0.11 |
| 4 | 0.40 | 0.32 | 0.26 | 0.22 | 0.21 |
| 5 | 0.80 | 0.68 | 0.62 | 0.53 | 0.54 |
| 6 | 1.63 | 1.57 | 1.55 | 1.56 | 1.46 |
| 7 | 3.57 | 3.50 | 3.60 | 3.62 | 3.63 |
| 8 | >5   | >5   | >5   | >5   | >5   |
| 9 | >5   | >5   | >5   | >5   | >5   |

The mask is therefore open in the middle tone area, especially stages 2–5, and is covered in the highlight and shadow areas and thus, in combination with the corresponding color separation, allows the desired correction of the middle tone area. Thus, after a first exposure with the color separation alone, a second exposure is made with the combination color separation/mask. Behind the "open" areas of the mask an overexposure of these areas occurs leading to the desired change (growth) in dot size.

EXAMPLE 2a (Control)

In the color cube according to FIG. 2, the green tone with the coordinate d4 is to be intensified without influencing the color tones of its surroundings, especially e4. According to the process of the state of the art, the correction of green requires a mask of the following combination of color separations as determined from the mask-combination diagram of FIG. 1: cyan negative, magenta positive, yellow negative. On the top and the bottom of this combination, two matted spacer films (Cronaflex ® UC-7 Tracing Film) are bound on each side. A direct positive bright light film (Cronar ® BLD-4 Bright Light Duplicating Film) is exposed through the entire combination in register and, after developing as described in Example 1, yields the mask. The mask exhibits the density values listed in Table 1 below at the critical points.

To produce the corrected cyan color separation positive, the uncorrected positive is now first exposed onto a line contact film such as Cronar ® BLE-4 Bright Light Etchable Contact Film and then an additional exposure is carried out with the intercalation of the mask bound in accurate register. After developing the exposed line contact film as described in Example 1, a corrected positive with the dot sizes listed in Table 1 is obtained.

EXAMPLE 2b

According to the process of the invention, the following procedure is used: the point to be corrected (e4) exhibits half-tone values of cyan 38%, magenta 5%, yellow 32% in the three color separation positives. The corresponding negatives are therefore produced by recopying as described in Example 1 in correct tonal values to produce the cyan- and the yellow-positive. Moreover, according to the mask combination diagram of FIG. 1, a magenta positive is needed to correct green tones.

These films are bound in accurate register together with matt films (as described in Control Example 2a) and the light-sensitive masking-type film in the following order: two matt films—yellow negative—cyan negative—matt film—cyan positive—yellow positive—magenta positive—2 matt films—direct positive bright light film as described in Control Example 2a. The order of the film can be determined by computor program.

After exposure of the films in register and developing as described in Example 1 the mask obtained exhibits the density values listed in Table 1 below.

As described in Example 2a, the corrected color separation is produced with this mask. Table 1 below shows the results wherein the positions are found on the color cube of FIG. 2:

TABLE 1

| Position | d1 | d4 | e4 |
|---|---|---|---|
| Dot size of uncorrected cyan separation | 98% | 38% | 35% |
| Goal | 98% | 50% | 35% |
| Mask densities of | | | |
| Control (Ex. 2a) | 0.04 | 0.07 | 0.05 |
| Invention (Ex. 2b) | >4.5 | 0.18 | >4.5 |
| Dot size of corrected cyan separation | | | |
| Control (Ex. 2a) | 98% | 50% | 50% |
| Invention (Ex. 2b) | 98% | 50% | 35% |

In the areas that are not to be corrected (d1, e4) the mask of the invention exhibits a very high density; as shown in the corrected cyan separation Example 2b, the tonal values are therefore only increased, as intended, in area d4 but not also in area e4 as in Control Example 2a.

I claim:

1. Process for the production of photographic masks for tonal correction by dry dot etching comprising (A) exposing a silver halide photographic mask film behind a film combination, bound in accurate register, of a half-tone positive and half-tone negative of a color separation set and diffusion sheets, characterized in that the film combination comprises at least one pair of a positive and a negative of the same color separation, whereby the positive and negative are separated from one another by a film taken from the group consisting of spacer film and color separation film, and (B) developing the mask film.

2. Process according to claim 1 wherein the positive-negative pair of color separations used have half-tone values at the points to be corrected in the range of 30-70%.

3. Process according to claim 1 wherein the positive-negative pair of color separations used have half-tone values at the points to be corrected in the range of 40-60%.

4. Process according to claim 1 wherein the film combination contains up to five half-tone positives and -negatives, wherein at least one of them is a positive-negative pair belonging to the same color separation.

5. Process according to claim 1 wherein the spacer film is taken from the group consisting of transparent film, matted film, film support of a color separation, and combinations thereof and the thickness of the spacer film is 100 to 200 μm.

6. Process according to claim 1 wherein the film combination contains at least two diffusion sheets.

* * * * *